United States Patent
Mantegazza et al.

(10) Patent No.: US 9,852,789 B2
(45) Date of Patent: *Dec. 26, 2017

(54) TRANSIENT CURRENT-PROTECTED THRESHOLD SWITCHING DEVICES SYSTEMS AND METHODS

(71) Applicant: Intel Corporation, Santa Clara, CA (US)

(72) Inventors: Davide Mantegazza, Palo Alto, CA (US); Sandeep Guliani, Folsom, CA (US); Balaji Srinivasan, Folsom, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/333,096

(22) Filed: Oct. 24, 2016

(65) Prior Publication Data
US 2017/0186486 A1    Jun. 29, 2017

Related U.S. Application Data

(63) Continuation of application No. 14/998,179, filed on Dec. 26, 2015, now Pat. No. 9,478,286.

(51) Int. Cl.
*G11C 11/00* (2006.01)
*G11C 13/00* (2006.01)

(52) U.S. Cl.
CPC ........ *G11C 13/0004* (2013.01); *G11C 13/004* (2013.01); *G11C 13/0026* (2013.01); *G11C 13/0028* (2013.01)

(58) Field of Classification Search
USPC .................... 365/148, 163, 189.15
See application file for complete search history.

(56) References Cited

U.S. PATENT DOCUMENTS

| | | | | |
|---|---|---|---|---|
| 6,236,617 B1 * | 5/2001 | Hsu | .......... | G11C 8/08 365/230.06 |
| 8,045,394 B2 * | 10/2011 | Do | .......... | G11C 8/08 365/185.23 |
| 2015/0262661 A1 | 9/2015 | Chu et al. | | |

OTHER PUBLICATIONS

PCT Application No. PCT/US2016/063796; Filing Date Nov. 26, 2016, Davide Mantegazza, International Search Report, dated Feb. 23, 2017, 15 Pages.

* cited by examiner

*Primary Examiner* — Vu Le
(74) *Attorney, Agent, or Firm* — Thorpe North and Western, LLP; David W. Osborne

(57) ABSTRACT

Threshold switching devices demonstrating transient current protection through both insulation and repair current mechanisms, including associated systems and methods, are provided and discussed.

22 Claims, 5 Drawing Sheets

TRANSIENT CURRENT-PROTECTED THRESHOLD SWITCHING DEVICES SYSTEMS AND METHODS

PRIORITY DATA

This application is a continuation of U.S. patent application Ser. No. 14/998,179, filed Dec. 26, 2015, now issued as U.S. Pat. No. 9,478,286, which is incorporated herein by reference.

BACKGROUND

Phase change materials have properties that invite their use in a number of applications such as ovonic threshold switches and phase change memory (PCM). Different physical states of the phase change material have different levels of electrical resistance. For example, one state, such as an amorphous state, can have a high electrical resistance, while another state, such as a crystalline state, can have a low electrical resistance. In PCM, these different levels of electrical resistance can be used to store binary information. Each state is designated a different binary value, and once stored, information can be read by detecting the electrical resistance of the material. The fact that each state persists once fixed makes PCM a valuable non-volatile memory (NVM) type.

DESCRIPTION OF EMBODIMENTS

Figure 1:
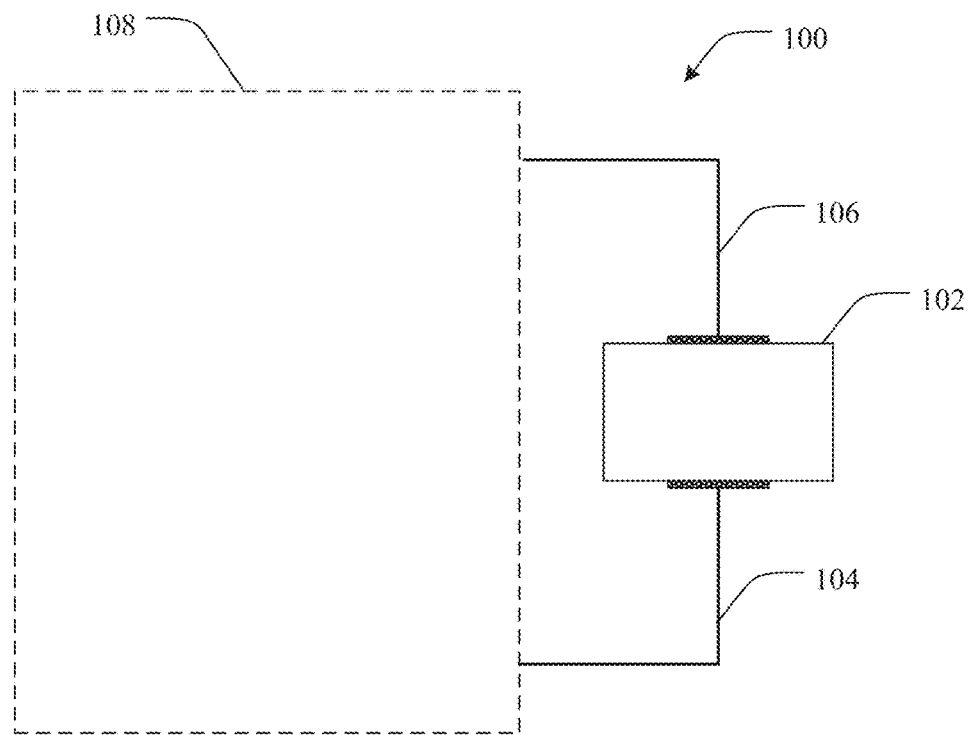
FIG. 1 is a schematic representation of an exemplary memory device.

Although the following detailed description contains many specifics for the purpose of illustration, a person of ordinary skill in the art will appreciate that many variations and alterations to the following details can be made and are considered included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies to both the form and function of individual components in a device or process, as well as to such devices or processes as a whole.

As used herein, "coupled" refers to a relationship of physical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

Threshold switching is a property of phase change materials that impacts the material's functionality. A typical phase change material in an amorphous state has a very high electrical resistance. In order to change the material to a crystalline state, extremely high voltages would be required to deliver sufficient current to heat the material above the crystallization temperature. However, when a voltage above a threshold voltage (Vt) is applied to the amorphous material, its electrical resistance greatly decreases and the material becomes electrically conductive. Once the material is electrically conductive current can suddenly flow in (e.g. during a write or programming operation) and rapidly heat and melt the material. If the current is abruptly switched off after melting, the material will return to the amorphous state, and the original Vt will recover slowly over time. If the material is heated to a temperature between the crystallization temperature (or glass transition temperature) and the melting point temperature for that material, and then maintained for a sufficient time, the phase change material will crystallize and subsequently cool in a more conductive state.

This threshold switching transition from the low-voltage/high-resistive state to the high-voltage/low-resistive state can be very fast, on the order of a few picoseconds. The voltage change across the device, however, is much slower, on the order of a few nanoseconds. As a result of this potential difference, a high transient current (i.e. snap back current) can flow into the device which can negatively affect the desired phase change material state.

In PCM, these parasitic or transient currents can result in data corruption and/or data loss. In some embodiments, however, a read operation can include the purposeful detection of such a transient current given an applied read bias. It can be beneficial, therefore, for the transient current to be reduced in magnitude or kept as low as possible, and that a repair mechanism be utilized to correct any disturb or damage that may occur. Accordingly, in one embodiment, a read operation comprises applying a read bias and electrically insulating the switching device from the high peripheral capacitance in order to minimize the magnitude of potentially damaging transient currents. The electrical insulation is then removed to allow a repair current to flow into the device. Such an approach of electrically insulting the device circuitry at the initiation of a read operation to diminish or otherwise minimize the transient current, and then delivering a repair current into the circuitry, can overcome many of the potentially damaging effects of high transient currents.

In one example embodiment, as shown in FIG. 1, a switching device 100 can comprise a phase change material 102, a word line (WL) 104, and a bit line (BL) 106 coupled across the phase change material to the WL 104. The switching device 100 also comprises circuitry 108 generally represented by the dashed box. The circuitry 108 is generally configured to electrically insulate the phase change material from potentially damaging transient currents when a read operation has been initiated, remove the electrical insulation, and apply a repair current to the phase change material of the device. Various circuit designs can be utilized in this way, and any such circuit design is considered to be within the present scope.

Figure 2:
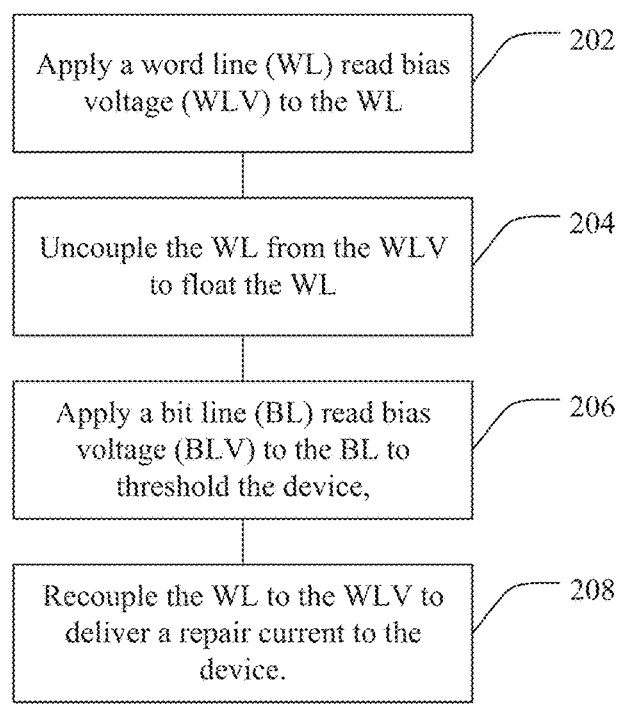
FIG. 2 is a depiction of steps of an exemplary method of repairing transient current induced damage in a switching device.

FIG. 2 shows a non-limiting example embodiment of one methodology that could result from various circuit designs. In this case, the circuitry is configured at 202 to apply a WL read bias voltage (WLV) to the WL, 204 uncouple the WL from the WLV to float the WL, 206 apply a BL read bias voltage (BLV) to the BL, such that the BLV and the WLV at the floating WL threshold (i.e. activate) the device, and 208 recouple the WL to the WLV to deliver a repair current to the device. It is noted that the aforementioned methodology as described with respect to the WL and BL elements is not limiting, and includes embodiments whereby the WL and BL elements are switched with one another. Additionally, WL and BL terms are used for convenience, and it should be understood that the present scope encompasses electrodes that may not traditionally be considered to be either a BL or a WL. Thus, throughout the present specification, the terms "first electrode" and "second electrode" or similar terms can be substituted for "BL" and "WL."

Figure 3:
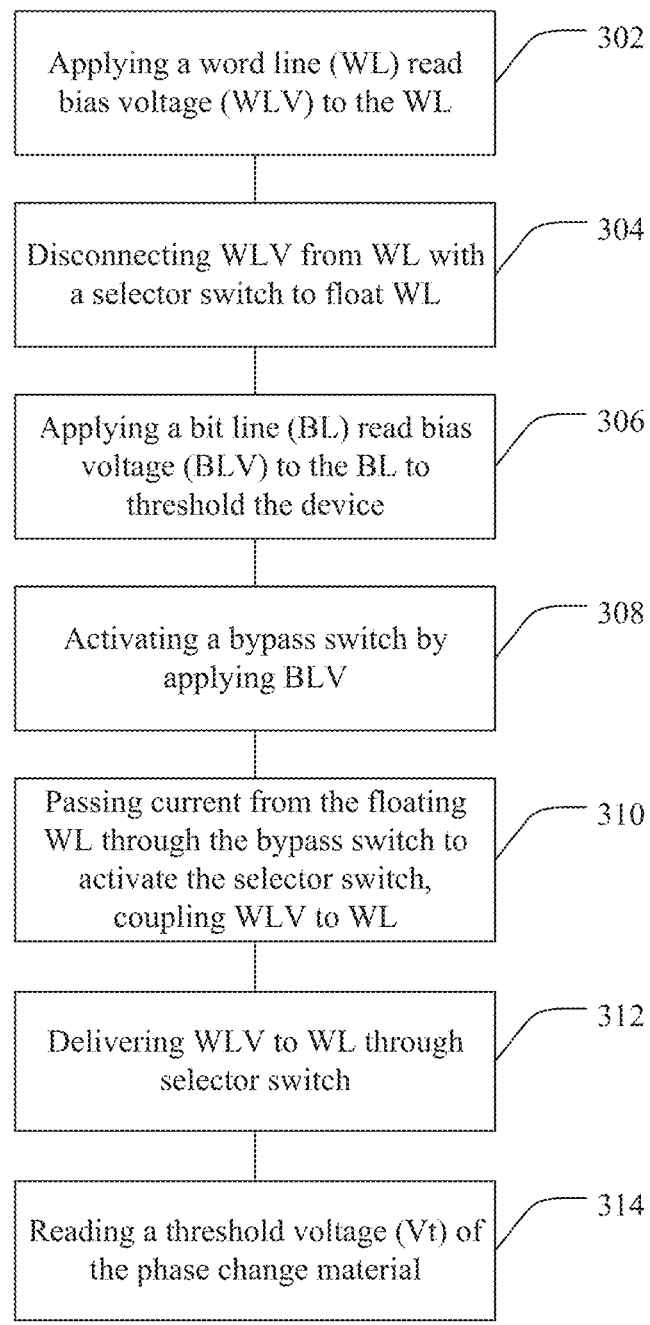
FIG. 3 is a depiction of steps of an exemplary method for managing transient current-induced damage in a switching device.

In another embodiment, as is shown in FIG. 3, a method of managing transient current-induced damage in a switching device comprises: 302 applying WLV to a WL, 304 disconnecting WLV from WL with a selector switch to float the WL, and 306 applying BLV to the BL to activate the device. WLV is applied to WL while BL is at zero bias, or at least at a sufficiently low bias that the switching device does not activate. Once BLV is applied to the BL, the phase change material activates due to the voltage potential across the BL and the floating WL, which in some cases can result in a large transient current. Disconnecting or uncoupling WLV from the WL prior to activating the device provides electrical insulation to the switching device by protecting the phase change material from the large transient current. The method can further comprise 308 activating a bypass switch by applying BLV and 310 passing current from the floating WL through the bypass switch to activate the selector switch, thus coupling WLV to WL.

In other words, BLV is applied to the bypass switch to cause the bypass switch to activate. The now activated bypass switch passes current generated from the floating WL to the selector switch that had previously disconnected WLV from the WL. The selector switch is activated by the current, thus recoupling the WLV to the WL, and 312 WLV is subsequently delivered to WL through the selector switch, which can, in some cases, act to repair any damage done by a high transient current. The method can also comprise 314 reading the Vt of the phase change material to determine the state of the switching device.

As has been described, various circuit designs are contemplated that realize a fast read scheme, and that minimize damaging transient currents, and that provide a repair current to the device following the occurrence of any such transient currents. As such, the circuitry described herein is not limiting, and the present scope is considered to extend to all circuitry and circuit elements capable of achieving the described functionality.

Figure 4:
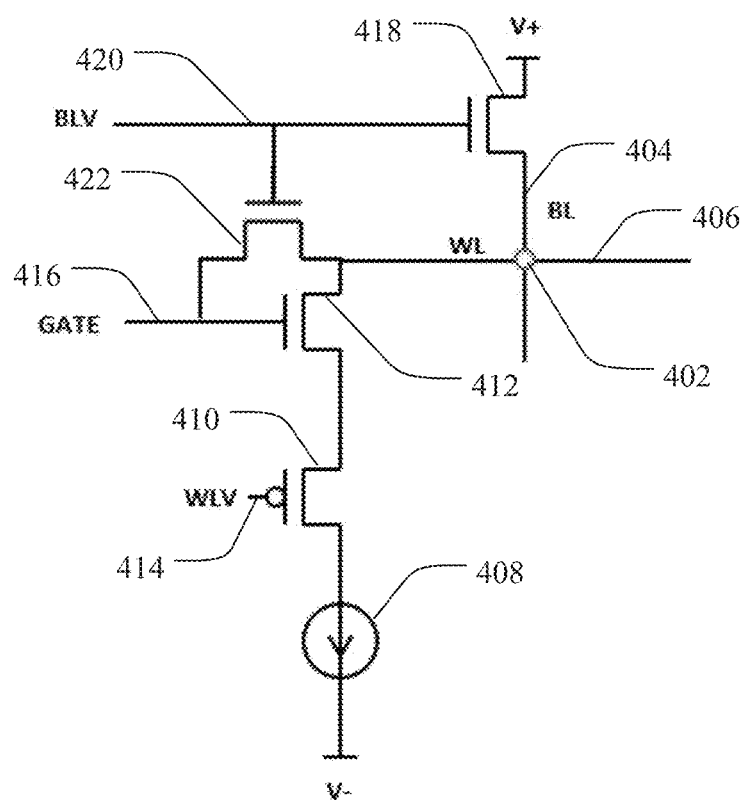
FIG. 4 is a schematic of an exemplary electronic circuit of a memory device.

One embodiment of a useful circuit, for example, is shown in FIG. 4. The circuitry comprises a switch node 402, representing the phase change or other material of a switching device. A BL 404 and a WL 406 are coupled, or electrically coupled, across the phase change material at the switch node 402. A current source 408 is coupled to the switch node 402 via the WL 406 through a WL device select switch 410 and a WL select switch 412. In the circuit design shown in FIG. 4, the WL device select switch 410 can comprise a cascode PMOS transistor having a WLV control input 414. The WL select switch 412 can comprise an NMOS transistor having a GATE control input 416. As such, the WL select switch 412 is operable to gate the coupling of WLV to the WL. The BL side of the circuit comprises a BL device select switch 418 coupled along the BL 404. The BL device select switch 418 can comprise a cascode NMOS transistor having a BLV control input 420 to gate current flow to the switch node 402. The WL 406 is coupled to the GATE control input 416 of the WL select switch 412 through a bypass switch 422 that is gated by the BLV control input 420. In one embodiment, the bypass switch is an NMOS transistor.

When a read operation is triggered, the circuitry operates in two stages, an electrical insulation stage, where an open circuit limits current flow to the switch node 402, and a second stage, where the circuit is closed and a repair current is applied to the switch node 402. It is noted that the electrical insulation can be applied from either the WL or the BL, depending on the circuit design. The present example relating to FIG. 4, however, applies the electrical insulation from the WL side, which should not be seen as limiting. It is contemplated, therefore, that the circuit architecture can be reversed to provide the electrical insulation from the BL side. Additionally, the description that the circuitry operates in "two stages" should not be taken to mean that each stage is discrete from one another at either the circuit or the functional level, but is intended to conceptualize two effects for explanation purposes only.

Figure 5:
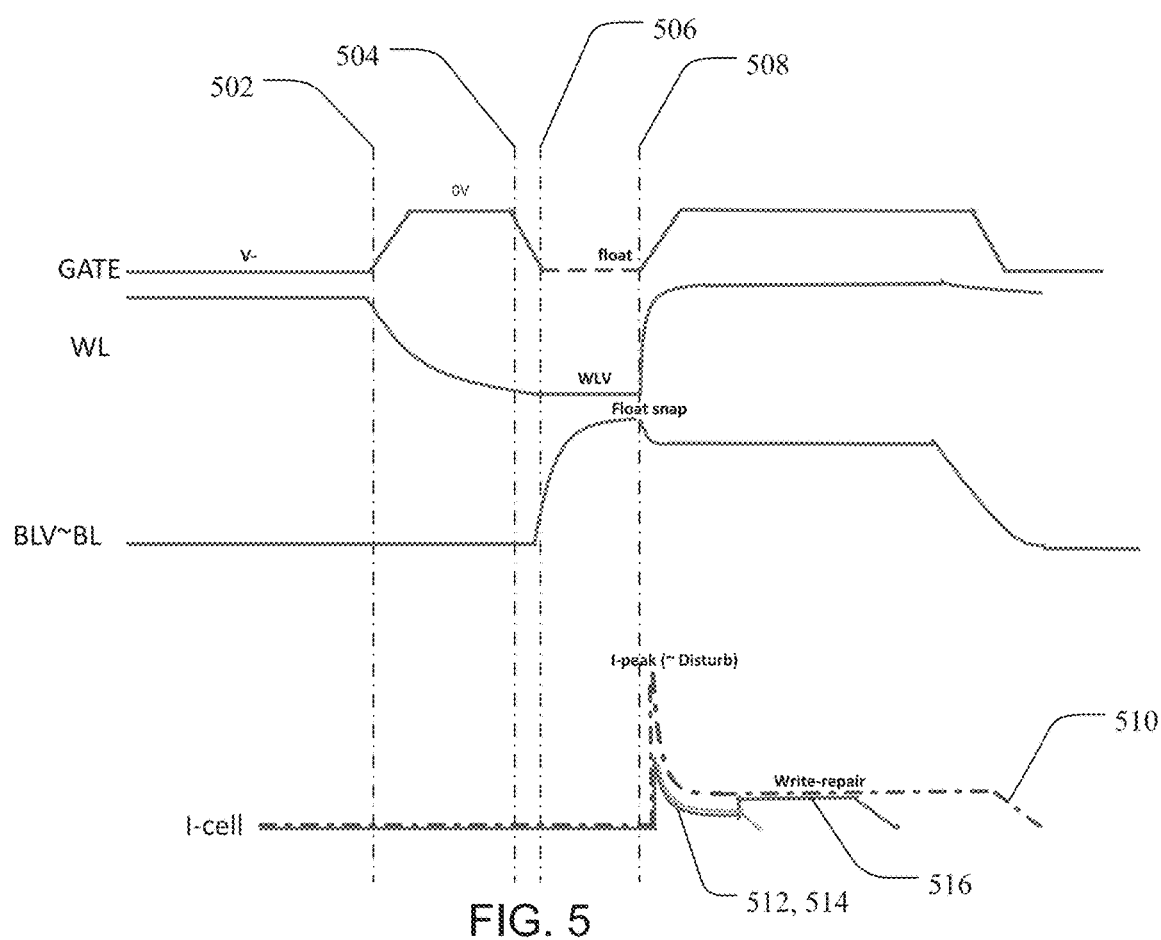
FIG. 5 is a graphical depiction of exemplary simulation data.

Referring to FIG. 4 and the voltage and current traces in FIG. 5, in the first stage of the read operation a bias is applied to the WLV control input 414 of the WL device selector switch 410 to activate the selected circuit. A bias is also applied to the GATE control input 416 to activate the WL select switch 412 at the point indicated at 502, thus allowing current flow to the switch node 402. The switch biases can be applied sequentially or simultaneously, as current flows once both switches are activated. Once the WL 406 is at WLV, the bias is removed from the GATE control input 416 at the point indicated at 504, the WL select switch 412 is deactivated, and WL 406 is floated or electrically insulated from the WL peripheral circuit (i.e., the WLV current source 408). This electrical insulation results in a lower effective capacitance affecting, or otherwise contributing to, the transient current. The WLV charge will temporarily remain at the floating WL 406, however, dissipating slowly over time.

In some cases, however, electrically insulating the circuit may not be sufficient to avoid all damage and/or corruption. In such cases, the damage and/or corruption can be rectified by applying a repair current to the device. In one embodiment, such a repair current can be directly applied from a separate circuit, controller or processor. In another embodiment, the repair current can be gated, or otherwise triggered from a source within the local circuit. Utilizing the local circuit to supply the repair current provides several advantages, such as faster response time, synchronization with the read operation, lower processing overhead, and the like. In one embodiment, the circuitry shown in FIG. 4 delivers a repair current to the device in the second stage of the read operation.

In the second stage of the read operation, a bias is applied to the BLV control input 420 at the BL device select switch 418 to activate the BL side of the circuit at the point indicated at 506. As a result, current flows to the switch node 402 and charges the BL 404 to BLV at the point indicated at 508. The bias applied to the BLV control input 420 additionally activates the bypass switch 422. If the bias across the switch node 402 is greater than the Vt of the phase change material, the phase change material will switch from the high resistance state to the low resistance state, the device will activate, and current (represented in FIG. 5 as I-cell) will begin to flow through the circuit at the point indicated at 508. Because the WL 406 is floating, the negative charge is discharged, resulting in a net positive current through the bypass switch 422 that was previously activated by BLV. As can be seen in FIG. 5 at point 508, the discharging current of the WL 406 drives the GATE control input 416 voltage of the WL select switch 412 to an active state, in this case 0V. Activation of the WL select switch 412 causes the WL 406 to recouple to WLV, thus removing the electrical insulation. Because of the delay in activating the WL select switch 412 due to the discharge time course of the floating WL, however, the transient current has been greatly reduced across the switch node 402.

Once the circuit has been closed by activating the WL select switch 412, current from the current source 408 flows across the switch node 402 to repair damage that may have been caused by the transient current. Transient currents from three general examples are shown in the current traces at the bottom of FIG. 5. In one example, no insulation 510 is provided by the circuitry, and as a result, a transient current with a large magnitude is generated. In this case, the phase change material will experience the high magnitude transient current, and damage is likely to occur. In another example, full insulation with no repair current 512 results in a transient current with a lower magnitude. In such cases, however, some damage and/or corruption can still occur. Since the circuit is open due to the floating WL, delivery of a repair current to the device is prevented. In yet another example, full insulation with a repair current 514 results in a transient current with a lower magnitude and device repair from the prolonged repair current 516. Applying the insulation of the "full float read" to minimize the transient current spike and applying the repair current to repair any damage that occurs, a very fast read operation is provided with, in some cases, a significant energy reduction.

The presently disclosed subject matter can be utilized in a variety of applications, from gate devices to memory storage and more, including combinations thereof. In one embodiment, for example, a switching device can be used as a circuit gate or switch to provide a non-volatile gating or selector element. In another embodiment, a switching device can comprise a phase change memory (PCM), and the switching or phase change material can be the PCM material, the select device material, or both. One example of a PCM array utilizes a number of various cross-point memory architectures that can be extremely scalable, both in terms of smaller devices and larger arrays. Larger PCM arrays tend to have larger transient currents and thus larger read disturb risks, which is even more pronounced with scaled devices. These risks are overcome by way of the presently disclosed subject matter, which also provides fast, low-energy read operations that benefit performance and device lifespan. PCM arrays having architectures other than cross-point arrays can also similarly benefit, and are considered to be within the present scope.

Furthermore, embodiments can be utilized in any device or system having PCM or other phase switching devices. While any type or configuration of device or computing system is contemplated to be within the present scope, non-limiting examples can include laptop computers, tablet computers, smart phones, CPU systems, SoC systems, server systems, networking systems, storage systems, high capacity memory systems, or any other computational system.

Figure 6:
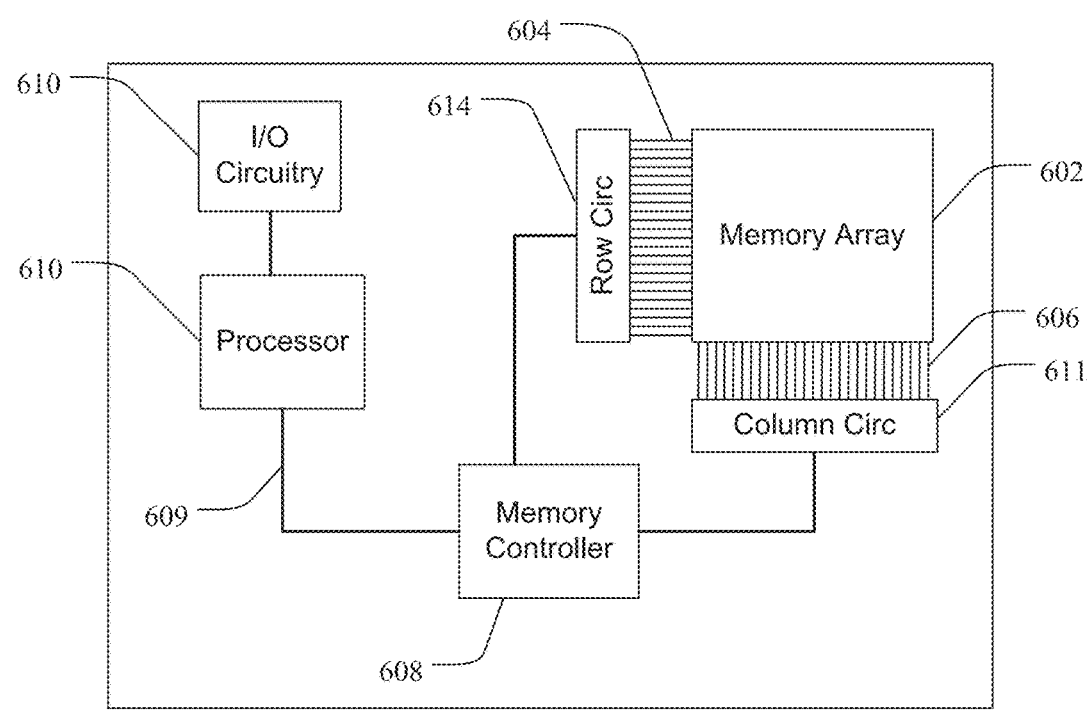
FIG. 6 is a schematic representation of an exemplary computational system.

Referring to FIG. 6, one example embodiment of a computing system can comprise a memory array 602 including a plurality of phase change memory (PCM) cells arranged in an array, a plurality of WLs 604 coupled to groups of PCM cells across the memory array 602, and a plurality of BLs 606 coupled to groups of PCM cells across the memory array, such that each PCM cell is addressed in the array by a unique combination of a WL and a BL. The system can also include circuitry (not shown) electrically coupled to each WL and to each BL. The circuitry can comprise various components and can perform various functions, including generating memory control commands, addressing the PCM cells in the array 602, reading a state of each PCM cell in the array, and they like. In one embodiment, the circuitry can read the state of PCM cells in the memory array as has been described herein. The system can also comprise a memory controller 608 coupled to the memory array and the WLs 604 and the BLs 606 to address and control the plurality of PCM cells in the memory array 602.

The system can also include I/O (input/output) circuitry 610 or interface for controlling the I/O functions of the system, as well as for I/O connectivity to devices outside of the system. A network interface can also be included for network connectivity. The network interface can control network communications both within the system and outside of the system. The network interface can include a wired interface, a wireless interface, a Bluetooth interface, optical interface, and the like, including appropriate combinations thereof.

The system can also include a processor 612 coupled to the I/O circuitry 610 and to the memory controller 608. The processor can be a single or multiple processors, and can communicate locally through a local communication interface 609 that can be used as a pathway to facilitate communication between any of a single processor, multiple processors, a single memory, multiple memories or memory arrays, the various interfaces, and the like, in any useful combination. For example, the local communication interface can be a local data bus and/or any related address or control busses as may be desired.

Furthermore, row circuitry 614 is coupled to the WLs 604 and to the memory controller 608, while column circuitry 611 is coupled to the BLs 606 and the memory controller 608. The column circuitry and the row circuitry are configured to address the plurality of PCM cells in the array along the BLs and WLs. The system can also include any number of user interfaces, display devices, as well as various other components that would be beneficial for such a system.

The system can also comprise additional memory that can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The system can additionally include a local communication interface for connectivity between the various components of the system.

As described, the system can include an I/O interface for controlling the I/O functions of the system, as well as for I/O connectivity to devices outside of the system. A network interface can also be included for network connectivity, either as a separate interface or as part of the I/O interface. The network interface can control network communications both within the system and outside of the system. The network interface can include a wired interface, a wireless interface, a Bluetooth interface, optical interface, and the like, including appropriate combinations thereof. Furthermore, the system can additionally include a user interface, a display device, as well as various other components that would be beneficial for such a system.

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

EXAMPLES

The following examples pertain to specific embodiments and point out specific features, elements, or steps that can be used or otherwise combined in achieving such embodiments.

In one example there is provided, a switching device, comprising:
   a phase change material;
   a word line (WL);
   a bit line (BL) coupled to the WL across the phase change material; and
   circuitry configured to:
      apply a WL read bias voltage (WLV) to the WL;
      uncouple the WL from the WLV to float the WL;
      apply a BL read bias voltage (BLV) to the BL, such that the BLV and the WLV at the floating WL activate the device; and
      recouple the WL to the WLV to deliver a repair current to the device.

In one example of a switching device, the circuitry comprises:
   a WL select switch coupled between the WLV the WL that is operable to gate coupling of the WLV to the WL; and
   a control input coupled to the WL select switch to operate the WL select switch.

In one example of a switching device, the WL select switch is an NMOS transistor.

In one example of a switching device, applying the BLV to the BL activates the WL select switch to couple the WLV to the WL.

In one example of a switching device, the circuitry comprises a bypass switch gated by the BLV, wherein activation of the bypass switch delivers current from the floating WL to gate the WL select switch, thereby coupling the WLV to the WL.

In one example of a switching device, the bypass switch is an NMOS transistor.

In one example of a switching device, the circuitry further comprises a WL device select switch coupled to the WL between the WL select switch and a power source, wherein the WL device select switch is gated by the WLV.

In one example of a switching device, the WL device select switch is a PMOS transistor.

In one example of a switching device, the circuitry further comprises a BL device select switch coupled to the BL between the BL and a power source, wherein the BL device select switch is gated by the BLV.

In one example of a switching device, the BL device select switch is an NMOS transistor.

In one example of a switching device, the device further comprises a phase change memory material coupled between the WL and the BL adjacent to the phase change material.

In one example of a switching device, the device further comprises:
   a plurality of phase change material elements arranged in an array;
   a plurality of WLs coupled to groups of phase change material elements across the array;
   a plurality of BLs coupled to groups of phase change memory elements across the array, such that each phase change memory element is addressed in the array by a unique combination of a WL and a BL; and
   a controller coupled to the plurality of WLs and the plurality of BLs to address the plurality of phase change material elements in the array.

In one example of a switching device, each of the plurality of phase change material elements further comprises a phase change memory material coupled adjacent to the phase change material and between the WL and the BL.

In one example of a switching device, the phase change material element is a phase change memory material.

In one example of a switching device, the switching device is an ovonic threshold switch.

In one example of a switching device, the switching device is a phase change memory device.

In one example there is provided, a phase change memory device, comprising:
   a plurality of memory cells arranged in an array, each memory cell further comprising:
      a select device (SD) material; and
      a phase change memory (PCM) material electrically coupled to the SD material;
   a plurality of word lines (WLs) coupled to groups of memory cells across the array;
   a plurality of bit lines (BLs) coupled to groups of memory cells across the array, such that each memory cell is addressed in the array by a unique combination of a WL and a BL; and
   circuitry electrically coupled to each WL and to each BL, the circuitry configured to:
      select a memory cell to be read having a selected BL (BLS) a selected WL (WLS) that uniquely addresses the selected memory cell;
      apply a WL read bias voltage (WLV) to the WLS;
      uncouple the WLS from the WLV to float the WLS;
      applying a BL read bias voltage (BLV) to the BLS, such that the BLV and the WLV at the floating WLS activate the device; and
      recouple the WLS to the WLV to deliver a repair current to the device.

In one example of a phase change memory device, the device further comprises a memory controller coupled to the plurality of WLs and the plurality of BLs to address the plurality of phase change memory devices in the array.

In one example of a phase change memory device, the circuitry comprises:
   a WL select switch coupled between the WLV the WLS that is operable to gate coupling of the WLV to the WLS; and a control input coupled to the WL select switch to operate the WL select switch.

In one example of a phase change memory device, the WL select switch is an NMOS transistor.

In one example of a phase change memory device, applying the BLV to the BLS activates the WL select switch to couple the WLV to the WLS.

In one example of a phase change memory device, the circuitry comprises a bypass switch gated by the BLV, wherein activation of the bypass switch delivers the WLV from the floating WLS to gate the WL select switch, thereby coupling the WLV to the WLS.

In one example of a phase change memory device, the bypass switch is an NMOS transistor.

In one example of a phase change memory device, the circuitry further comprises a WLS device select switch coupled to the WLS between the WL select switch and a power source, wherein the WLS device select switch is gated by the WLV.

In one example of a phase change memory device, the WLS device select switch is a PMOS transistor.

In one example of a phase change memory device, the circuitry further comprises a BLS device select switch coupled to the BLS between the BLS and a power source, wherein the BLS device select switch is gated by the BLV.

In one example of a phase change memory device, the BLS device select switch is an NMOS transistor.

In one example there is provided, a method of managing transient current-induced damage in a switching device, comprising:

selecting a switching device comprising a phase change material having a word line (WL) and a bit line (BL) electrically coupled across the phase change material;

applying a WL read bias voltage (WLV) to the WL;

uncoupling the WL from the WLV to float the WL;

applying a BL read bias voltage (BLV) to the BL, such that the BLV and the WLV at the floating WL activate the device; and reapplying the WLV to the WL to deliver a repair current to the device.

In one example of a a method of managing transient current-induced damage in a switching device, applying the WLV to the WL further comprises activating a WL select switch coupled between the WLV the WL.

In one example of a a method of managing transient current-induced damage in a switching device, applying the BLV to the BL activates the WL select switch to reapply the WLV to the WL.

In one example of a a method of managing transient current-induced damage in a switching device, applying the BLV to the BL activates a bypass switch that delivers current from the floating WL to the WL select switch to reapply the WLV to the WL.

In one example there is provided a computing system, comprising:

a memory array, further comprising:

a plurality of phase change memory (PCM) cells arranged in an array;

a plurality of word lines (WLs) coupled to groups of PCM cells across the array; and a plurality of bit lines (BLs) coupled to groups of PCM cells across the array, such that each PCM cell is addressed in the array by a unique combination of a WL and a BL; and circuitry electrically coupled to each WL and to each BL, the circuitry configured to:

generate memory control commands;

address the PCM cells in the array; and read a state of each PCM cell in the array by:

selecting a PCM cell to be read having a selected BL (BLS) a selected WL (WLS) that uniquely addresses the selected PCM cell;

applying a WL read bias voltage (WLV) to the WLS;

uncoupling the WLS from the WLV to float the WLS;

applying a BL read bias voltage (BLV) to the BLS, such that the BLV and the WLV at the floating WLS activate the PCM cell; and recoupling the WLS to the WLV to deliver a repair current to the PCM cell.

In one example of a computing system, the system further comprises a memory controller coupled to the plurality of WLs and the plurality of BLs to address the plurality of PCM cells in the array.

In one example of a computing system, the circuitry comprises:

a WL select switch coupled between the WLV the WLS that is operable to gate coupling of the WLV to the WLS; and a control input coupled to the WL select switch to operate the WL select switch.

In one example of a computing system, the WL select switch is an NMOS transistor.

In one example of a computing system, applying the BLV to the BLS activates the WL select switch to couple the WLV to the WLS.

In one example of a computing system, the circuitry comprises a bypass switch gated by the BLV, wherein activation of the bypass switch delivers the WLV from the floating WLS to gate the WL select switch, thereby coupling the WLV to the WLS.

In one example of a computing system, the bypass switch is an NMOS transistor.

In one example of a computing system, the circuitry further comprises a WLS device select switch coupled to the WLS between the WL select switch and a power source, wherein the WLS device select switch is gated by the WLV.

In one example of a computing system, the WLS device select switch is a PMOS transistor.

In one example of a computing system, the circuitry further comprises a BLS device select switch coupled to the BLS between the BLS and a power source, wherein the BLS device select switch is gated by the BLV.

In one example of a computing system, the BLS device select switch is an NMOS transistor.

In one example of a computing system, the circuitry further comprises I/O circuitry configured to control I/O operations of the system.

In one example of a computing system, the system further comprises the I/O circuitry is configured to communicate with a processor.

In one example of a computing system, the circuitry further comprises:

row circuitry coupled to the WLs; and column circuitry coupled to the BLs, the column circuitry and the row circuitry being configured to address the plurality of PCM cells in the array.

In one example of a computing system, the circuitry further comprises read/write circuitry coupled to the row circuitry and the column circuitry and configured to control read and write commands to and from plurality of PCM cells of the array.

While the forgoing examples are illustrative of the principles of embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A computing system, comprising:
   a memory array, further comprising:
      a plurality of phase change memory (PCM) cells arranged in an array;
      a plurality of word lines (WLs) coupled to groups of PCM cells across the array; and
      a plurality of bit lines (BLs) coupled to groups of PCM cells across the array, such that each PCM cell is addressed in the array by a unique combination of a WL and a BL; and
   circuitry electrically coupled to each WL and to each BL, the circuitry configured to:
      generate memory control commands;
      address the PCM cells in the array; and
      read a state of each PCM cell in the array by:
         selecting a PCM cell to be read having a selected BL (BLS) a selected WL (WLS) that uniquely addresses the selected PCM cell;
         applying a WL read bias voltage (WLV) to the WLS;
         uncoupling the WLS from the WLV to float the WLS;
         applying a BL read bias voltage (BLV) to the BLS, such that the BLV and the WLV at the floating WLS activate the PCM cell; and
         recoupling the WLS to the WLV to deliver a repair current to the PCM cell.

2. The system of claim 1, further comprising a memory controller coupled to the plurality of WLs and the plurality of BLs to address the plurality of PCM cells in the array.

3. The system of claim 2, wherein the circuitry comprises:
   a WL select switch coupled between the WLV and the WLS, the WL select switch operable to gate coupling of the WLV to the WLS; and
   a control input coupled to the WL select switch to operate the WL select switch.

4. The system of claim 3, wherein the WL select switch comprises an NMOS transistor.

5. The system of claim 3, wherein the BLS is to activate the WL select switch to couple the WLV to the WLS in response to application of the BLV to the BLS.

6. The system of claim 5, wherein the circuitry comprises a bypass switch gated by the BLV, wherein activation of the bypass switch delivers the WLV from the floating WLS to gate the WL select switch, thereby coupling the WLV to the WLS.

7. The system of claim 6, wherein the bypass switch comprises an NMOS transistor.

8. The system of claim 2, wherein the circuitry further comprises a WLS device select switch coupled to the WLS between the WL select switch and a power source, wherein the WLS device select switch is gated by application of the WLV to the WLS device select switch.

9. The system of claim 8, wherein the WLS device select switch comprises a PMOS transistor.

10. The system of claim 2, wherein the circuitry further comprises a BLS device select switch coupled to the BLS between the BLS and a power source, wherein the BLS device select switch is gated by application of the BLV to the BLS device select switch.

11. The system of claim 10, wherein the BLS device select switch comprises an NMOS transistor.

12. The system of claim 1, wherein the circuitry further comprises I/O circuitry configured to control I/O operations of the system.

13. The system of claim 12, wherein the I/O circuitry is configured to communicate with a processor.

14. The system of claim 1, wherein the circuitry further comprises:
   row circuitry coupled to the WLs; and
   column circuitry coupled to the BLs, the column circuitry and the row circuitry being configured to address the plurality of PCM cells in the array.

15. The system of claim 14, wherein the circuitry further comprises read/write circuitry coupled to the row circuitry and the column circuitry and configured to control read and write commands to and from plurality of PCM cells of the array.

16. The system of claim 2, further comprising one or more of:
   at least one processor communicatively coupled to the system;
   a display communicatively coupled to the system;
   a battery coupled to the system; or
   a network interface communicatively coupled to the system.

17. A switching device, comprising:
   a phase change material;
   a word line (WL);
   a bit line (BL) coupled to the WL across the phase change material; and
   circuitry configured to:
      activate the device by floating the WL and applying a BL read bias voltage (BLV); and
      deliver a repair current by recoupling the WL to a WL read bias voltage (WLV).

18. The device of claim 17, wherein the circuitry comprises:
   a WL select switch coupled between the WLV and the WL, the WL select switch operable to gate coupling of the WLV to the WL; and
   a control input coupled to the WL select switch to operate the WL select switch.

19. The device of claim 17, further comprising a phase change memory material coupled between the WL and the BL adjacent to the phase change material.

20. The device of claim 17, further comprising:
   a plurality of phase change material elements arranged in an array;
   a plurality of WLs coupled to groups of phase change material elements across the array;
   a plurality of BLs coupled to groups of phase change memory elements across the array, such that each phase change memory element is addressed in the array by a unique combination of a WL and a BL; and
   a controller coupled to the plurality of WLs and the plurality of BLs to address the plurality of phase change material elements in the array.

21. The device of claim 1, wherein the switching device comprises an ovonic threshold switch.

22. The device of claim 1, wherein the switching device comprises a phase change memory device.

* * * * *